United States Patent
Yuen et al.

(10) Patent No.: US 6,647,050 B2
(45) Date of Patent: Nov. 11, 2003

(54) FLIP-CHIP ASSEMBLY FOR OPTICALLY-PUMPED LASERS

(75) Inventors: Albert T. Yuen, Los Altos, CA (US); Michael R. T. Tan, Menlo Park, CA (US); Dubravko Ivan Babic, Palo Alto, CA (US); Scott William Corzine, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/954,825

(22) Filed: Sep. 18, 2001

(65) Prior Publication Data

US 2003/0053510 A1 Mar. 20, 2003

(51) Int. Cl.[7] ................................................. H01S 5/00
(52) U.S. Cl. ........................................... 372/96; 372/75
(58) Field of Search .............................. 372/96, 75, 50; 385/93

(56) References Cited

U.S. PATENT DOCUMENTS

| | | | |
|---|---|---|---|
| 5,513,204 A | 4/1996 | Jayaraman | 372/96 |
| 5,754,578 A | 5/1998 | Jayaraman | 372/50 |
| 5,914,976 A * | 6/1999 | Jayaraman et al. | 372/50 |
| 6,014,240 A * | 1/2000 | Floyd et al. | 359/201 |
| 6,246,708 B1 * | 6/2001 | Thornton et al. | 372/50 |
| 6,252,896 B1 * | 6/2001 | Tan et al. | 372/50 |
| 6,434,180 B1 * | 8/2002 | Cunningham | 372/50 |

* cited by examiner

*Primary Examiner*—Paul Ip
*Assistant Examiner*—Dung Nguyen

(57) ABSTRACT

A short-wavelength vertical cavity surface emitting laser (VCSEL) is flip-chip bonded to a long-wavelength VCSEL. The short-wavelength VCSEL is used to optically-pump the long-wavelength VCSEL. Certain embodiments of the invention can serve as optical sources for optical fiber communication systems. Methods also are provided.

16 Claims, 4 Drawing Sheets

# FLIP-CHIP ASSEMBLY FOR OPTICALLY-PUMPED LASERS

TECHNICAL FIELD

The present disclosure generally relates to semiconductor device manufacture, and, more particularly, to methods for fabricating optically-pumped vertical cavity surface-emitting lasers ("VCSELs").

DESCRIPTION OF THE RELATED ART

Optical communication systems are now commonly used for exchanging information via light wave signals. Laser diodes or "semiconductor lasers" are often the preferred optical source for such an optical communication system. This is due, primarily, to the narrow "spectral linewidth" (or range of wavelengths) at which these devices produce light and their fast modulation rates.

Semiconductor lasers generally include an "optical cavity" with an "active region" arranged between two "reflectors." Light from the active region bounces back and forth between these reflectors, gaining intensity with each cycle, until a portion of the light is allowed to escape the oscillator cavity. So-called "edge-emitting" lasers produce light from between the layers of the structure, substantially parallel to the active region, while "surface-emitting" lasers emit light substantially perpendicular to the layers forming the active region.

"Vertical-cavity" surface-emitting lasers, or VCSELs, have a number of advantages over traditional edge-emitting lasers, including low manufacturing cost, good beam quality, low current operation and scalability. These properties make VCSELs desirable for many applications, and VCSELs that can produce long-wavelength light (1300 nm–1550 nm) are of particular interest in optical communications. In VCSELs, the optical cavity is typically arranged between two "distributed Bragg reflectors," or "DBRs." In simple terms, each of these DBRs consists of alternating layers of materials where each layer is partially reflective and has a different "refractive index" and thickness. The reflections from each of the layers add together in unison depending upon the wavelength of light. Consequently, DBRs act essentially as wavelength-selective, or filtering, reflectors for returning light over a range of wavelengths. The range of wavelength or "stopband" depend on the index contrast and layer thicknesses.

VCSELs may be electrically or optically driven. A conventional "current-injection" VCSEL includes two ohmic contacts for applying an electrical current to the active region. Typically, one of the ohmic contacts is located below the substrate, while the other ohmic contact is located above the top DBR. When voltage is applied to the contacts, electrical current is injected into the active region, causing the active region to emit light. Instead of electrical current, a conventional "optically pumped" VCSEL includes, or is operationally associated with, a light source. For example, the pump may be another VCSEL or a light-emitting diode. Light from the pump enters the active region and produces the stimulated emission.

U.S. Pat. No. 5,513,204 to Jayaraman describes an optically pumped VCSEL device that includes a short-wavelength VCSEL that optically pumps a long-wavelength VCSEL. The long-wavelength VCSEL is coupled to the short-wavelength VCSEL by a layer of adhesive material. The adhesive material may be a transparent, optical adhesive material or a metallic bonding material. In an alternative embodiment, the VCSELs are fusion bonded to form a monolithic structure.

Another optically pumped VCSEL device is described in U.S. Pat. No. 5,754,578, which is also issued to Jayaraman. One embodiment of this VCSEL device includes a short-wavelength VCSEL and a long-wavelength VCSEL that are formed on a single GaAs substrate. The short-wavelength VCSEL includes a current confining scheme which may be provided by proton implantation or by an oxidation layer. U.S. Pat. Nos. 5,513,204 and 5,754,578 are incorporated by reference into this application.

Of particular interest, the Jayaraman devices use wafer bonding, epoxy bonding or metal-to-metal bonding to form VCSEL devices. Such bonding techniques are known to exhibit voids and non-uniform bonding of the wafers of the VCSEL devices. These non-uniform conditions can cause mechanical stress in the devices and can lead to poor device performance.

What is needed is a laser that exhibits good beam quality, low current operation and scalability. Such a laser also should be fabricated using techniques that reduce mechanical stress so that the performance of the laser does not become degraded during operation.

SUMMARY OF THE INVENTION

The invention involves the fabrication of optically-pumped lasers through the use of flip-chip bonding techniques. Flip-chip bonding can help reduce or eliminate non-uniformities due to voids and poor bonding across the wafers of the optically-pumped lasers. Flip-chip bonding also can reduce the high stress conditions typically associated with wafer-bonded, unmatched material systems that can lead to poor reliability. These techniques also can enable an optically-pumped long-wavelength VCSEL of an optically-pumped laser device to be heatsunk through the short-wavelength VCSEL down to a heat-dissipating structure.

A method for fabricating an optically-pumped laser includes filling a well of one of the VCSELs with solder paste. The solder paste is then heated to a temperature above a wetting-point temperature of the solder paste, and then cooled to a temperature below the wetting-point temperature to form a solder bump. After cooling, the solder bump protrudes above the top of the well. To attach the VCSELs to each other, the solder bump can be engaged with the other VCSEL. Then, the solder bump can be reheated to a temperature above the wetting-point temperature and subsequently cooled to a temperature below the wetting-point temperature. This process affixes the VCSELs to each other. Note, in some embodiments, the solder bump can be reheated until the pad of the other of the VCSELs aligns with the solder bump.

Various techniques can be used to fill the well of a VCSEL with solder. For instance, the solder can be applied by vaporization, electroplating, printing, sputtering, setting, stud-bumping or direct placement.

Flip-chip bonding enables the short- and long-wavelength VCSEL devices to be processed and optimized separately. The devices can then be attached on a wafer-scale or as discrete devices. Wafer-scale attachment enables many devices to be attached at the same time, resulting in cost savings due to reduced assembly time. However, discrete device flip-chip bonding also can be done at the end of the assembly process, thus providing flexibility in wavelength selection, since the wavelength of the product can be determined near the end of the assembly process.

An embodiment of an optical communication system of the invention includes an optically-pumped laser, an optical waveguide and an optical detector. In particular, the optically-pumped laser includes a short-wavelength VCSEL pump that is flip-chip bonded to a long-wavelength VCSEL. The optical waveguide optically communicates with the optically-pumped laser and is used to transmit light from the optically-pumped laser. The optical detector optically communicates with the optical waveguide and is used to detect light from the waveguide.

Clearly, some embodiments of the invention may address shortcomings of the prior art in addition to, or in lieu of, those described here. Additionally, other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
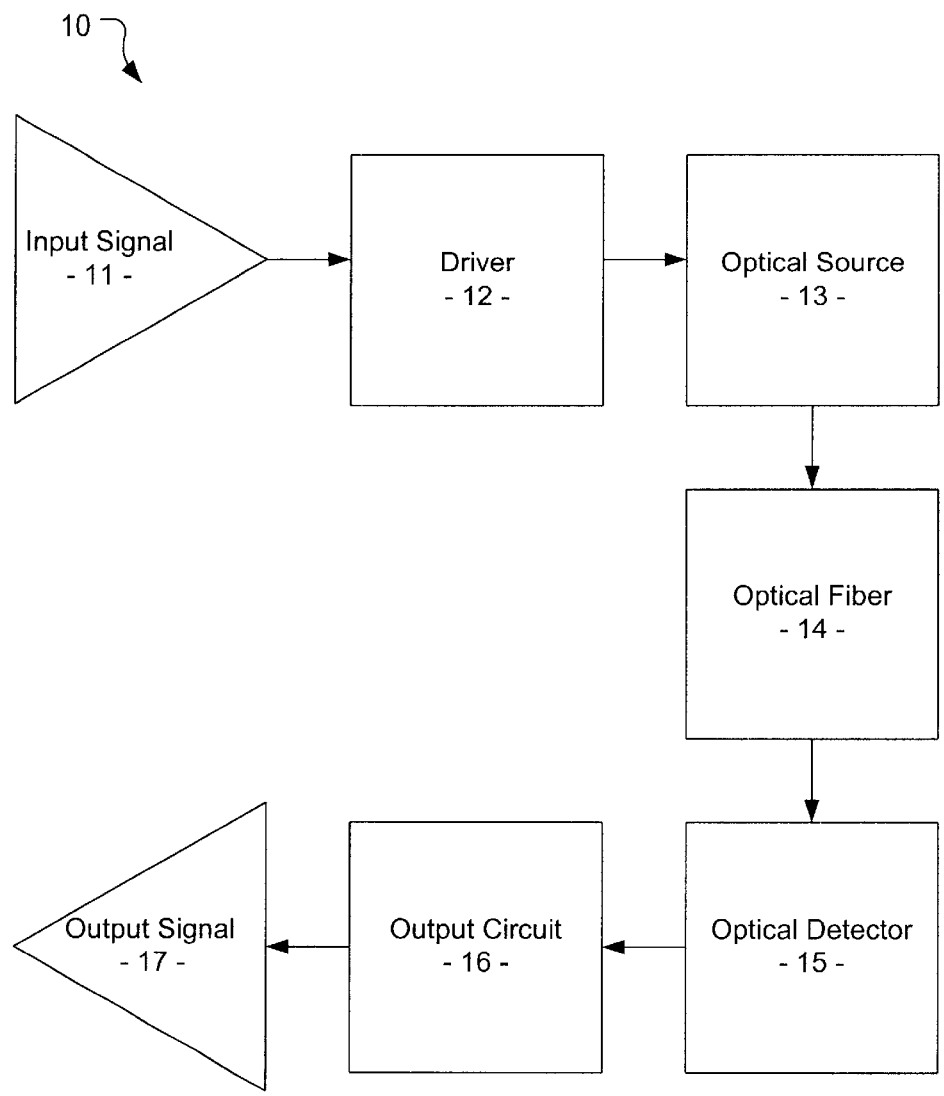
FIG. 1 is a conceptual block diagram of an embodiment of an optical communication system of the present invention.

Referring now to the figures, FIG. 1 is a conceptual block diagram of an embodiment of an optical "fiber" communication system 10 in which an input signal 11 is provided to a driver 12 that controls an optical source 13. Light waves from the optical source 13 are then transmitted over an optical fiber, or other "waveguide," 14 for reception by an optical detector 15 and forwarding to an output circuit 16 that produces an output signal 17.

The performance of this, so-called "fiber optic," communication system is generally limited by the "attenuation" and "dispersion" of the optical fiber waveguide 14. Attenuation, or fiber loss, refers to a decrease in the optical power of the transmitted signal that is caused by "absorption" (conversion to heat), "scattering" (ejection from the core of the waveguide), and other extrinsic effects. Dispersion, on the other hand, refers to the spreading of optical pulses into longer time intervals that limit the rate at which data can be transmitted through the waveguide. These and other aspects of fiber-optic transmission are discussed in Freeman, *Practical Data Communication*, Section 10.2 (John Wiley & Sons 1995) which is incorporated by reference here.

At certain wavelengths of transmitted light, the dispersion approaches a minimum for conventional fused-silica, single mode fiber waveguides. Although the exact wavelength at which this phenomenon occurs is a function of the core diameter and refractive index profile of the waveguide 14, the range typically extends from a wavelength of about 1300 nanometers ("nm") for a 10-micron core to about 1600 nm (1.6 micrometers "$\mu$m") for a 4-micron core. Fortunately, attenuation is also minimized for a wavelength range, or "band," of around 1300 nm and 1500 nm. Consequently, it is desirable to have an optical source 13 that produces light in a single, relatively-long wavelength, on the order of approximately 1300–1550 nm in order to minimize dispersion and attenuation. As described in greater detail below, optical source 13 can be an optically-pumped laser that is formed by a flip-chip bonding technique(s). Additional information concerning laser sources for optical communication systems is available in Senior, *Optical Communication Systems*, pp. 281–373 (Prentice Hall, 2d Ed 1992) which is also incorporated by reference here.

Figure 2:
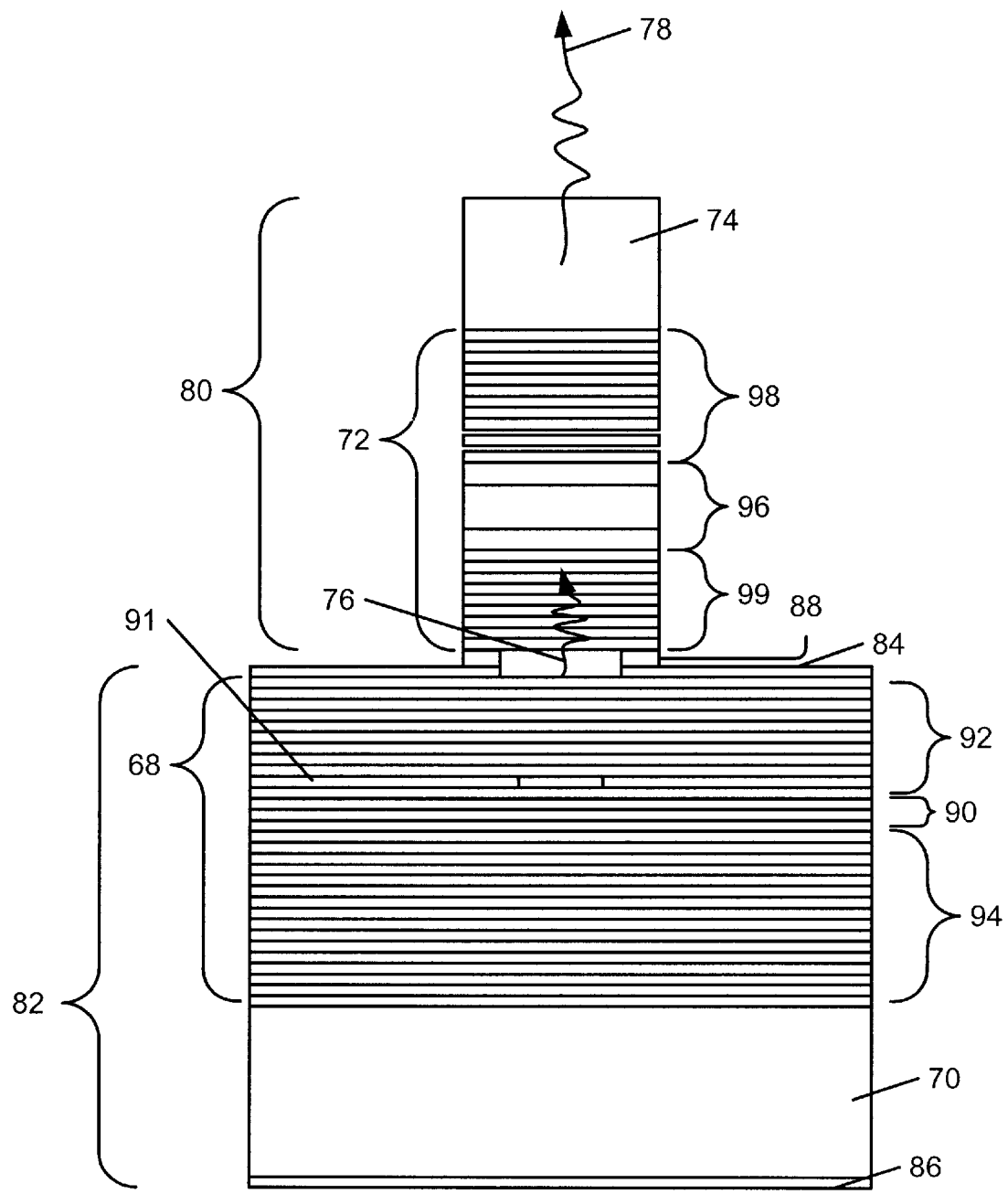
FIG. 2 is a cross-sectional view of an optically pumped long-wavelength VCSEL of the invention that can be used in the optical communication system of FIG. 1.

FIG. 2 is a cross-section of an embodiment of an optically-pumped vertical-cavity surface-emitting laser (VCSEL) device 66. The VCSEL device 66 may be used as the optical source 13 in an optical communication system 10 (FIG. 1) to transmit optical data. The VCSEL device 66 includes a short-wavelength VCSEL 68 formed on a substrate 70 and a long-wavelength VCSEL 72 formed on a substrate 74. The short-wavelength VCSEL 68 is designed to emit light 76 having a short peak wavelength in response to current injection. The long-wavelength VCSEL 72 is designed to emit light 78 having a long peak wavelength in response to absorption of the short-wavelength light 76. Therefore, the short-wavelength VCSEL 68 drives the long-wavelength VCSEL 72 by emitting the short-wavelength light 76 which optically pumps the long-wavelength VCSEL 72. Preferably, the short-wavelength light 76 has a peak wavelength at 850–1200 nm and the long-wavelength light 78 has a peak wavelength between 1250 nm and 1700 nm.

The VCSEL device 66 is not a monolithic structure. The VCSEL device 66 is made of two separate structures 80 and 82 that have been bonded together. The upper structure 80 includes the long-wavelength VCSEL 72 and the substrate 74. The lower structure 82 includes contact layers 84 and 86, the short-wavelength VCSEL 68 and the substrate 70. The long-wavelength VCSEL 72 and the short-wavelength VCSEL 68 are adjacently positioned such that the substrates 70 and 74 are separated by the VCSELs 68 and 72. The two structures 80 and 82 are bonded by an adhesive material 88. For example, the adhesive material 88 may be a transparent optical adhesive material or a metallic bonding material. The bonding of the structures 80 and 82 is preferably accomplished at a low temperature to ensure that the VCSELs 68 and 72 are not damaged during the bonding process.

The short-wavelength VCSEL 68 of the structure 82 is comprised of an active region 90 and a current-confining oxidation layer 91 that are sandwiched between mirrors 92 and 94. The mirrors 92 and 94 are made of materials typically utilized to fabricate conventional short-wavelength VCSELs. Preferably, the mirrors 92 and 94 are semiconductor distributed Bragg reflectors (DBRs). The active region 90 preferably includes multiple quantum wells (not shown). The contact layers 84 and 86 that define the upper and lower surfaces of the structure 82 are made of a metallic material. Preferably, proton implantation or polyimide may be used to reduce the parasitic capacitance of the short wavelength VCSEL so as to allow for high speed modulation of the short wavelength VCSEL.

The light-emitting operation of the short-wavelength VCSEL 68 begins when voltage is applied to the contact layers 84 and 86. The applied voltage causes current to be injected into the active region 90, causing the quantum wells of the active region 90 to radiate light energy. The radiant light energy is reflected between the mirrors 92 and 94. Some of the radiant light energy escapes the cavity defined by the mirrors 92 and 94 as the short-wavelength light 76, which propagates toward the long-wavelength VCSEL 72. Typically, the reflectivity of the "bottom mirror" 94 is chosen to have a higher reflectivity such that most of the radiated light exits form mirror 92. However, some of the radiant light energy escapes the cavity as light having the same wavelength as the light 76 in the direction of the substrate 70. This light is eventually absorbed by the substrate 70. The properties of the substrate 70 are such that light having a wavelength of approximately 850 nm or shorter will be absorbed by the substrate.

The long-wavelength VCSEL 72 of the upper structure 80 comprises an active region 96 located between mirrors 98 and 99. The mirror 98 is a semiconductor DBR, while the mirror 99 is a dielectric DBR. The materials utilized to fabricate the active region 96 and the mirrors 98 and 99 are not critical to the invention.

The long-wavelength VCSEL 72 operates to generate the long-wavelength light 78 by absorbing the short-wavelength light 76 emitted from the short-wavelength VCSEL 68. The emitted short-wavelength light 76 propagates through the bottom mirror 99 of the long-wavelength VCSEL 72 and is absorbed by the active region 96. The absorption of the short-wavelength light 76 by the active region 96 drives the active region 96 to emit long-wavelength light. Some of the emitted long-wavelength light propagates in an upward direction toward the substrate 74. However, some of the long-wavelength light is emitted by the active region 96 in a downward direction toward the short-wavelength VCSEL 68.

This long-wavelength light propagates through the short-wavelength VCSEL 68 and the substrate 70. The downward propagating long-wavelength light eventually escapes the VCSEL device 66, exiting from an aperture formed in the bottom contact layer 86. Since the short-wavelength light emitted from the short-wavelength VCSEL 68 is absorbed by the substrate 70, the only light exiting the VCSEL 66 from the contact layer 86 is a portion of the long-wavelength light emitted from the long-wavelength VCSEL 72. Therefore, the intensity of the long-wavelength light generated by the long-wavelength VCSEL 72 may be monitored by placing a photodiode below the contact layer 86.

Figure 4:
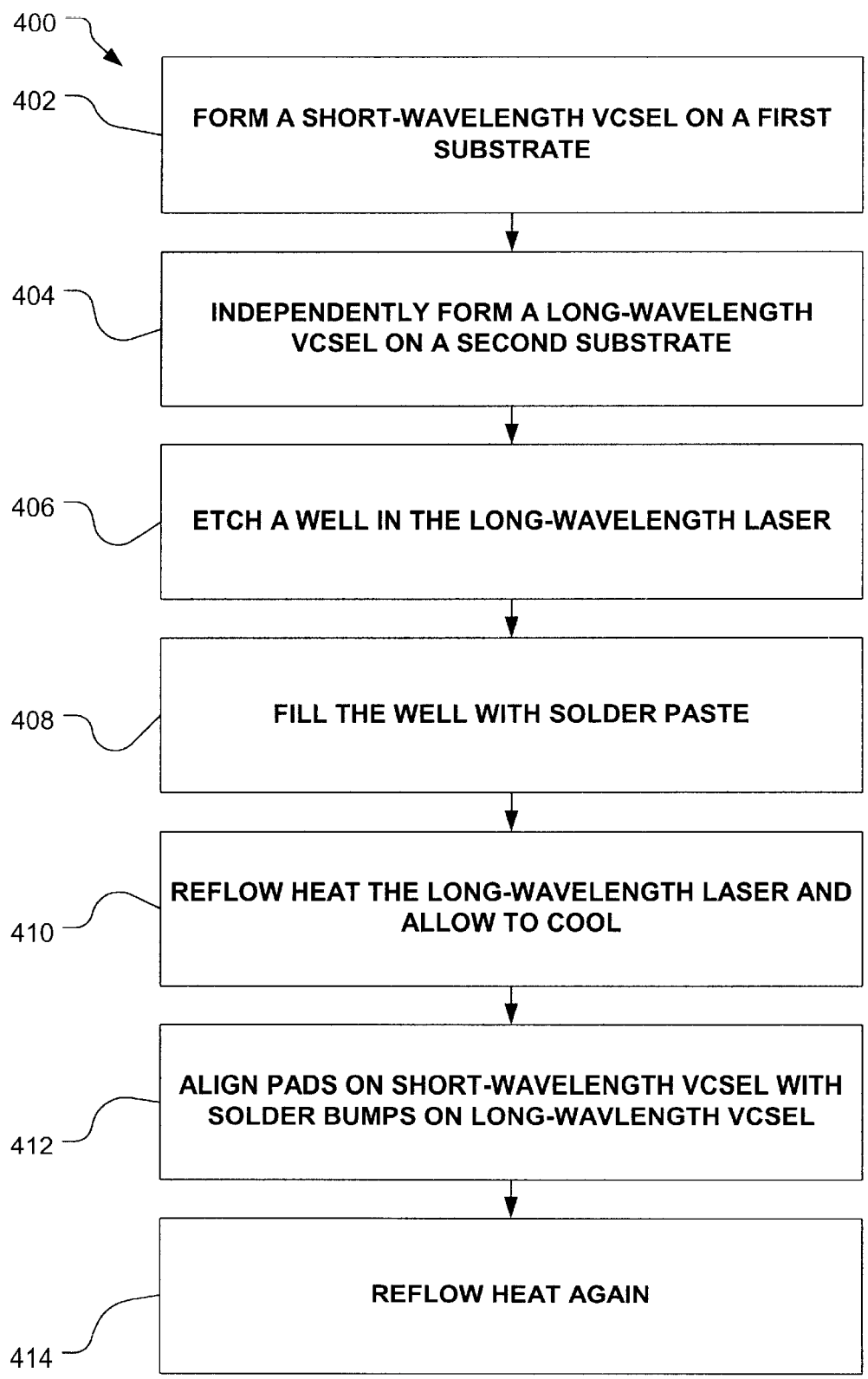
FIG. 4 is a conceptual block diagram for fabricating the VCSEL shown in FIG. 3.

A representative method for fabricating an optically-pumped VCSEL device will be described with reference to FIG. 4. At step 402, the short-wavelength VCSEL 68 is formed on a first substrate 70. The short-wavelength VCSEL may be a conventional current-driven VCSEL. Preferably, the short-wavelength VCSEL is configured to emit light having a peak wavelength of 850 nm. Next, at step 404, a long-wavelength VCSEL 72 is independently formed on a second substrate. Preferably, the long-wavelength VCSEL is configured to emit light having a peak wavelength between 1300 nm and 1550 nm by absorbing the short-wavelength light emitted from the short-wavelength VCSEL 68. In the preferred embodiment, the first and second substrates have a common transmittance characteristic of absorbing the light emitted from the short-wavelength VCSEL, while allowing the light emitted from the long-wavelength VCSEL to be transmitted through the substrates.

The short-wavelength VCSEL 68 is directly bonded onto the long-wavelength VCSEL 72, such that the first and second substrates 70, 74 are separated by the short-wavelength and long-wavelength VCSELs. A transparent optical adhesive material or a metallic bonding material may be utilized to bond the short-wavelength VCSEL 68 onto the long-wavelength VCSEL 72. However, flip-chip techniques are preferably used for the bonding. One such flip-chip bonding technique is illustrated by steps 406–414 in FIG. 4 referring to the schematic detail view of the bonding for device 66 that is illustrated in FIG. 3.

Figure 3:
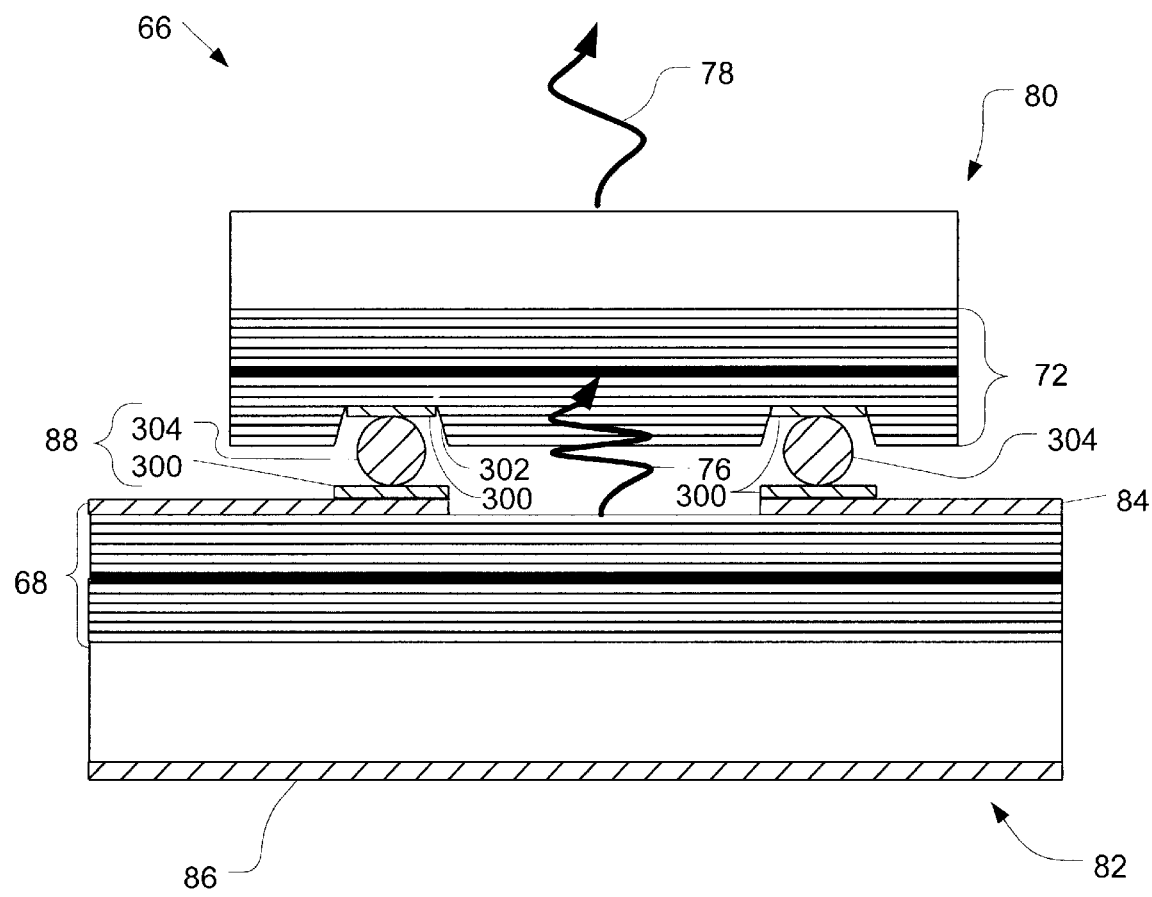
FIG. 3 is a schematic detail view of the bonding for the VCSEL in FIG. 2.

In FIG. 3, bond pads 300 have been provided on both VCSEL structures 80, 82. Alternatively, bond pads 300 may be provided on only one of the VCSELs or the device 66 may be bonded without bond pads 300. For example, the contact layer 84 may serve as a bond pad 300. The contact layer 84 may also be arranged so that bond pads 300 are secured directly to the short-wavelength VCSEL 68, such as inside the perimeter of the contact layer 84. Returning to FIG. 4, at least one, but preferably two or more, well(s) 302 are etched or otherwise formed in one of the long- or short-wavelength laser structures 80, 82. The wells 302 are also preferably provided with metal (or other material) bond pads 300. Although the method illustrated in FIG. 4 has been described with respect to the device 66 shown in FIG. 3, the position of the wells 302 may be reversed with respect to the VCSEL structures 80 and 82. Other types of planar laser structures, besides VCSELS may also be used.

Once the wells 302 have been formed and provided with any bond pads 300, they are at least partially filled with a bonding agent, such as a heat-activated or thermosetting bonding agent, like solder paste, at step 408. The solder paste is then melted at step 410, typically by placing the long-wavelength laser 72 in a "reflow oven." Upon cooling, the paste will preferably form a ball-shaped bump 304 extending above the top of the well 302 due to wettability of the surface of the bond pad 300. Typically, a dielectric layer with suitable openings is defined on bond pad 300 so as to restrict the reflow of the solder ball. Solder bumps 304 may also be formed in other ways including vaporization, electroplating, printing, sputtering, setting, stud bumping and/or direct placement. Other bonding materials besides solder paste may also be used.

The "bumped" long-wavelength VCSEL structure 80 is then turned over, or "flipped," and the bumps 304 are aligned and engaged with the bond pads 300 on the lower VCSEL structure 82 at step 412. The acceptable tolerance of this alignment will typically be around +/−2 mils. The stacked short- and long-wavelength VCSEL structures 80, 82 are again reflow heated at step 414 so as to adhere the solder bump 304 to the metal bond pads 300 on the lower structure 82. The second reflow heating 414 will preferably cause the VCSELs 80 and 82 to move into proper alignment due to surface tension effects between the solder bump 304 and the bonding surfaces on each of the VCSELs.

Although only a single VCSEL device has been described above, a one-dimensional array, or a two-dimensional array of optically pumped VCSEL devices may be fabricated by bonding an array of long-wavelength VCSELs to an array of short-wavelength VCSELs. Furthermore, a wavelength division multiplexing (WDM) array may be fabricated in a similar manner. The fabrication of the WDM array may be accomplished by configuring the array of long-wavelength VCSELs such that each long-wavelength VCSEL on the array of long-wavelength VCSELs is able to generate light having a specified peak wavelength from a selection of wavelengths. The number of different peak wavelengths may vary depending on the specification of the equipment in which the WDM arrays will be embodied. The wavelength variation on the array of long-wavelength VCSELs can be realized by selective-area growth to develop the long-wavelength VCSELs that can generate light having different peak wavelengths.

The method described above removes the complexity involved in wafer-bonding. For example, flip-chip bonding can help reduce or eliminate non-uniformities due to voids and poor bonding across the wafer. Flip-chip bonding also reduces the high stress conditions associated with wafer-bonded, unmatched material systems that can lead to poor reliability. This technique also enables the optically pumped long-wavelength VCSEL to be heatsunk through the short-wavelength VCSEL down to a heat dissipating package (not shown).

Furthermore, flip-chip bonding enables the short- and long-wavelength VCSEL devices to be processed and optimized separately. The devices can then be attached on a wafer-scale or as discrete devices. Wafer-scale attachment enables many devices to be attached at the same time, resulting in cost savings due to reduced assembly time. However, discrete device flip-chip bonding also can be done at the end of the assembly process, thus providing flexibility in wavelength selection, since the wavelength of the product can be determined near the end of the assembly process.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated.

For example, although a solder bump flip-chip bonding technique was described above, stud bump, polymer bump, and/or anistropic conductive film flip-chip bonding may also be used. Additional information concerning these, and other flip-chip bonding processes and products, is available through tutorials provided by Flip Chips Dot Com of Worcester, Mass., which are hereby incorporated by reference. All such modifications and variations are within the scope of the invention as determined by the appended claims.

What is claimed is:

1. A method for fabricating an optically-pumped laser, said method comprising:
   providing a short-wavelength vertical-cavity surface-emitting laser (VCSEL);
   providing a long-wavelength VCSEL, wherein at least one of the VCSELs includes a well;
   providing a solder paste;
   filling the well with the solder paste;
   heating the solder paste to a temperature above a wetting-point temperature of the solder paste; and
   cooling the solder paste to a temperature below the wetting-point temperature to form a solder bump, the solder bump protruding above the top of the well.

2. The method of claim 1, further comprising:
   engaging the solder bump on the one of the VCSELs with the other VCSEL;
   reheating the solder bump to a temperature above the wetting-point temperature of the solder paste; and
   cooling the solder bump to a temperature below the wetting-point temperature.

3. The method of claim 1, wherein filling the well comprises:
   applying the solder paste by one of the group consisting of: vaporization, electroplating, printing, sputtering, setting, stud-bumping and direct placement.

4. The method of claim 2, wherein the other of the VCSELs has a pad; and
   wherein reheating the solder bump comprises:
      reheating the solder bump until the pad of the other of the VCSELs aligns with the solder bump.

5. The method of claim 1, further comprising:
   providing a heat-dissipating structure; and
   thermally coupling the long-wavelength VCSEL through the short-wavelength VCSEL to the heat-dissipating structure.

6. An optically-pumped laser fabricated by the method of claim 1.

7. An optically-pumped laser comprising:
   a short-wavelength vertical cavity surface-emitting laser (VCSEL);
   a long-wavelength VCSEL, at least one of the short-wavelength VCSEL and the long-wavelength VCSEL including a well, the well being sized and shaped to receive solder paste;
   wherein the short-wavelength VCSEL is solder flip-chip bonded to the long-wavelength VCSEL with solder paste located in the well.

8. The optically-pumped laser of claim 7, wherein:
   the short-wavelength VCSEL defines the well containing the solder paste; and
   the long-wavelength VCSEL includes a pad, the pad being affixed to the solder paste.

9. The optically-pumped laser of claim 7, wherein:
   the long-wavelength VCSEL defines the well containing the solder paste; and
   the short-wavelength VCSEL includes a pad, the pad being affixed to the solder paste.

10. The optically-pumped laser of claim 7, further comprising:
    means for affixing the long-wavelength VCSEL to the short-wavelength VCSEL.

11. The optically-pumped laser of claim 7, further comprising:
    a heat-dissipating structure thermally coupled to the long-wavelength VCSEL such that heat generated by the long-wavelength VCSEL is provided to the heat-dissipating structure through the short-wavelength VCSEL.

12. A method for producing an optical signal, said method comprising:
    providing a short-wavelength vertical-cavity surface-emitting laser (VCSEL) and a long-wavelength VCSEL, at least one of the short-wavelength VCSEL and the long-wavelength VCSEL including a well, the well being sized and shaped to receive solder paste wherein the short-wavelength VCSEL is solder flip-chip bonded to the short-wavelength VCSEL using solder paste arranged in the well;
    generating short-wavelength optical signals with the short-wavelength VCSEL; and
    propagating the short-wavelength optical signals to the long-wavelength VCSEL such that the long-wavelength VCSEL generates long-wavelength optical signals.

13. The method of claim 12, further comprising:
    providing a heat-dissipating structure; and thermally coupling the long-wavelength VCSEL through the short-wavelength VCSEL to the heat-dissipating structure.

14. An optical communication system comprising:

an optically-pumped laser comprising:
- a short-wavelength vertical-cavity surface-emitting laser (VCSEL); and
- a long-wavelength VCSEL, at least one of the short-wavelength VCSEL and the long-wavelength VCSEL including a well, the well being sized and shaped to receive solder paste, wherein the short-wavelength VCSEL is solder flip-chip bonded to the long-wavelength VCSEL with solder paste located in the well;

an optical waveguide optically communicating with the optically-pumped laser for transmitting light from the optically-pumped laser; and an optical detector optically communicating with the optical waveguide for detecting light from the waveguide.

15. The optical communication system of claim 14, further comprising:

means for affixing the long-wavelength VCSEL to the short-wavelength VCSEL.

16. The optical communication system of claim 14, further comprising:

a heat-dissipating structure thermally coupled to the long-wavelength VCSEL such that heat generated by the long-wavelength VCSEL is provided to the heat-dissipating structure through the short-wavelength VCSEL.

* * * * *